(12) United States Patent
Blake, III et al.

(10) Patent No.: US 11,690,170 B2
(45) Date of Patent: Jun. 27, 2023

(54) DRIVER ASSIST SYSTEM

(71) Applicant: ZF Active Safety and Electronics US LLC, Livonia, MI (US)

(72) Inventors: Thomas E. Blake, III, Novi, MI (US); Robert J. Newton, Chesterfield, MI (US)

(73) Assignee: ZF Active Safety and Electronic US LLC, Livonia, MI (US)

( * ) Notice: Subject to any disclaimer, the term of this patent is extended or adjusted under 35 U.S.C. 154(b) by 221 days.

(21) Appl. No.: 16/759,000

(22) PCT Filed: Nov. 2, 2018

(86) PCT No.: PCT/US2018/058883
§ 371 (c)(1),
(2) Date: Apr. 24, 2020

(87) PCT Pub. No.: WO2019/090037
PCT Pub. Date: May 9, 2019

(65) Prior Publication Data
US 2021/0185797 A1    Jun. 17, 2021

Related U.S. Application Data

(60) Provisional application No. 62/675,287, filed on May 23, 2018, provisional application No. 62/581,146, filed on Nov. 3, 2017.

(51) Int. Cl.
*H05K 1/02* (2006.01)
*B60R 16/023* (2006.01)
*H04N 23/54* (2023.01)

(52) U.S. Cl.
CPC ......... *H05K 1/028* (2013.01); *B60R 16/0231* (2013.01); *H04N 23/54* (2023.01); *H05K 1/0274* (2013.01); *H05K 2201/10121* (2013.01); *H05K 2201/10151* (2013.01)

(58) Field of Classification Search
USPC .......................................................... 348/148
See application file for complete search history.

(56) References Cited

U.S. PATENT DOCUMENTS

| | | | |
|---|---|---|---|
| 6,288,386 B1 * | 9/2001 | Bowen | G02B 23/12 313/532 |
| 9,604,568 B1 * | 3/2017 | Salter | B60Q 1/2619 |
| 10,806,538 B2 * | 10/2020 | Farritor | A61B 34/35 |
| 2004/0132491 A1 * | 7/2004 | Kim | H04M 1/0218 348/E5.025 |
| 2006/0018098 A1 | 1/2006 | Hill et al. | |
| 2006/0138579 A1 * | 6/2006 | Shin | H01L 27/14685 257/433 |
| 2007/0024711 A1 * | 2/2007 | Daura Luna | B60R 11/04 348/148 |
| 2010/0025086 A1 | 2/2010 | Stahr et al. | |
| 2012/0013741 A1 | 1/2012 | Blake, III et al. | |

(Continued)

*Primary Examiner* — Nigar Chowdhury
(74) *Attorney, Agent, or Firm* — Kristin L. Murphy

(57) ABSTRACT

A driver assist system for a vehicle includes a housing and a lens having an axial end extending into the housing. A first printed circuit board (PCB) is connected to the housing. The first PCB has a rigid portion and a flexible portion. The rigid portion and the flexible portion extend along a common axis. An image sensor is mounted on the rigid portion of the PCB adjacent the axial end of the lens.

10 Claims, 2 Drawing Sheets

(56) References Cited

U.S. PATENT DOCUMENTS

| | | | | |
|---|---|---|---|---|
| 2012/0034857 A1* | 2/2012 | Blake, III | .......... | B60H 1/00785 |
| | | | | 454/75 |
| 2012/0051904 A1* | 3/2012 | Hagen | .................... | B62K 11/02 |
| | | | | 415/224 |
| 2012/0114280 A1* | 5/2012 | Pitwon | ................. | H05K 1/0274 |
| | | | | 29/829 |
| 2013/0148016 A1* | 6/2013 | Oh | ......................... | H04N 23/54 |
| | | | | 348/E5.026 |
| 2014/0036218 A1* | 2/2014 | Yu | ........................ | H05K 3/4691 |
| | | | | 349/200 |
| 2014/0160284 A1* | 6/2014 | Achenbach | ............. | B60R 11/04 |
| | | | | 29/854 |
| 2014/0373345 A1* | 12/2014 | Steigerwald | ........... | H04N 23/54 |
| | | | | 29/739 |
| 2015/0326756 A1* | 11/2015 | Knutsson | ............. | H04N 5/2257 |
| | | | | 348/148 |
| 2016/0167595 A1* | 6/2016 | Kang | ................... | H04N 5/2257 |
| | | | | 348/148 |
| 2017/0118838 A1* | 4/2017 | Williams | ............... | H05K 1/148 |
| 2017/0353645 A1* | 12/2017 | Shabtay | ............... | H04N 5/2253 |
| 2017/0353646 A1* | 12/2017 | Wang | ..................... | G02B 5/201 |

* cited by examiner

DRIVER ASSIST SYSTEM

CROSS-REFERENCE TO RELATED APPLICATIONS

This application is a national stage of International Application No. PCT/US18/58883 filed Nov. 2, 2018, the disclosure of which is incorporated herein by reference in its entirety, and which claimed priority from U.S. Provisional Application Ser. No. 62/581,146 filed Nov. 3, 2017 and U.S. Provisional Application Ser. No. 62/675,287 filed May 23, 2018, the subject matter of which are incorporated herein by reference in their entirety.

TECHNICAL FIELD

The present invention relates to a driver assist system for a vehicle, and, more specifically, to a driver assist system that maintains the position of an image sensor relative to a camera lens.

BACKGROUND

Vehicle driver assist systems that use a camera to monitor the environment surrounding the vehicle are known. A driver assist system can aid a driver in the operation of a motor vehicle by providing operational information such as a potential collision, lane or roadway departure, location of pedestrians, road sign information, etc. Data from the driver assist system is provided to other vehicle systems to provide the driver with a warning, haptic or tactile feedback, and/or autonomous control of the vehicle.

A driver assist system in a vehicle may include a camera that acquires information and provides the acquired information to a vehicle safety system designed to assist the driver. The camera may be mounted in any desired location in the vehicle, such as the vehicle windshield to ensure a desired field of view. The camera includes a lens. An image sensor on a printed circuit board (PCB) senses the image acquired by the lens. The image sensor may move relative to the lens in response to strain on the PCB. Movement of the image sensor relative to the lens may reduce the quality of the image.

SUMMARY

The present invention is directed to a driver assist system for a vehicle including a housing and a lens having an axial end extending into the housing. A first printed circuit board (PCB) is connected to the housing. The first PCB has a rigid portion and a flexible portion. The rigid portion and the flexible portion extend along a common axis. An image sensor is mounted on the rigid portion of the PCB adjacent the axial end of the lens.

BRIEF DESCRIPTION OF THE DRAWINGS

The foregoing and other features and advantages of the present invention will become apparent to one skilled in the art upon consideration of the following description of the invention and the accompanying drawings, in which.

DETAILED DESCRIPTION

Figure 1:
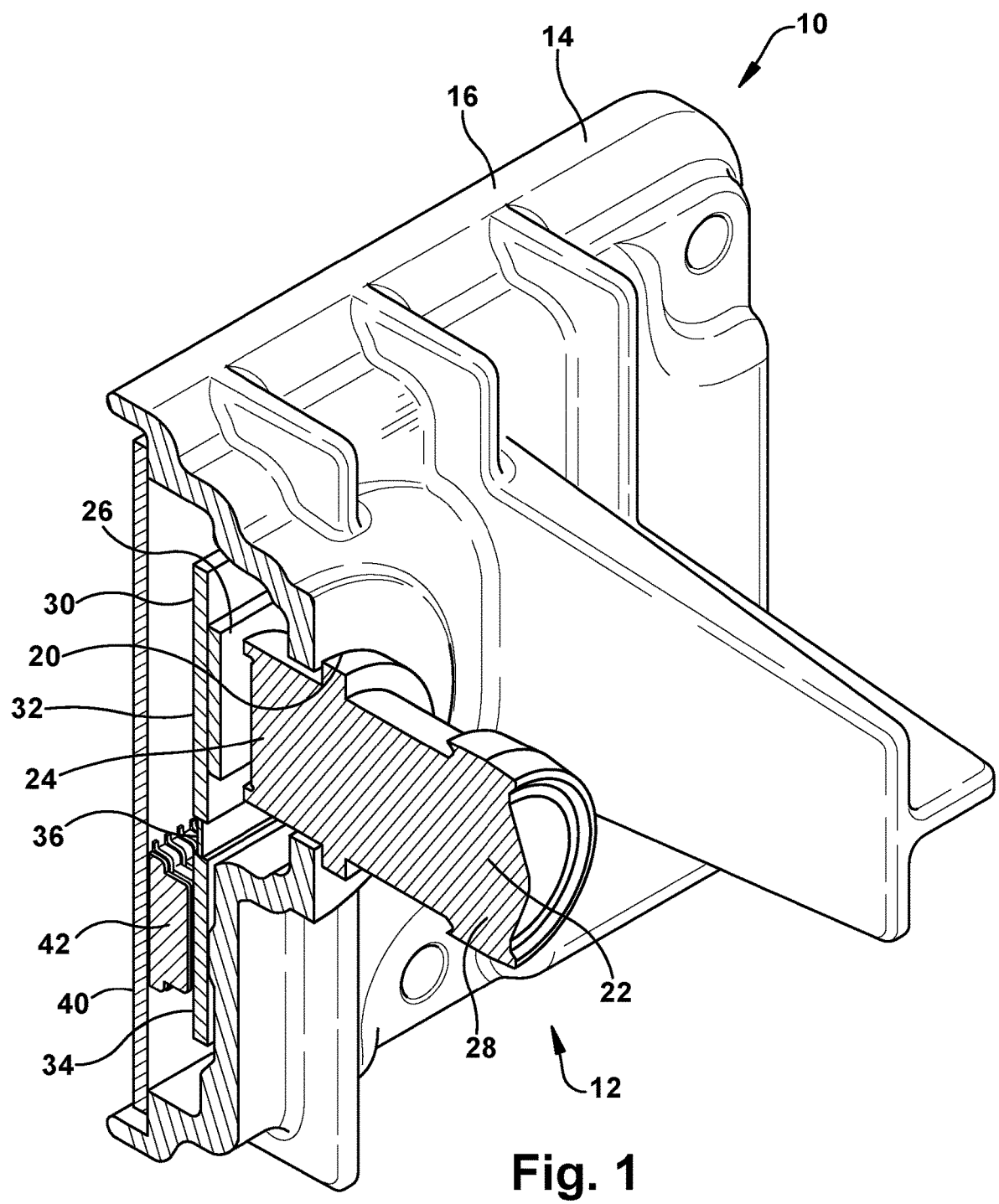
FIG. 1 is a schematic view of a driver assist system constructed in accordance with a first embodiment of the present invention.

FIG. 1 illustrates a driver assist system 10 constructed in accordance with the present invention. The driver assist system 10 includes a camera 12 having a housing 14. The housing 14 may have a first portion 16 and a second portion (not shown) connected to the first portion to define an interior of the housing 14. The first portion 16 of the housing 14 may have an opening 20 through which a lens 22 extends. A first axial end 24 of the lens 22 is fixed to the housing 14. The first axial end 24 is supported within the housing 14 adjacent an image sensor 26. A second axial end 28 of the lens 20 extends through the opening 20 out of the housing 14.

The image sensor 26 senses an image acquired by the lens 22 and provides at least one signal to a vehicle safety system to provide a vehicle operator with a warning, haptic or tactile feedback, and/or autonomous control of the vehicle. The image sensor 26 is mounted on an imager or first printed circuit board (PCB) 30. The first PCB 30 has a first rigid portion 32 and a second rigid portion 34 interconnected by a flexible portion or member 36. The first portion 34 of the PCB 30 is connected to the housing 14. The first and second rigid portions 32, 34 and the flexible portion 36 extend along a common axis. The first and second rigid portions 32, 34 may be coplanar.

The image sensor 26 is connected to the first rigid portion 32 of the first PCB 30. The flexible portion 36 allows the first and second rigid portions 32, 34 of the first PCB 30 to move relative to each other. The flexible portion 36 may have a thickness that is less than the thicknesses of the first and second rigid portions 32, 34. It is contemplated that the flexible portion 36 may be formed in one-piece with the first rigid portion 32 and/or the second rigid portion 34. The flexible portion 36 may be made of any desired material. The second rigid portion 34 of the first PCB 30 is connected to a second or main PCB 40 by a connector 42. The second PCB 40 is mounted in the housing 14 and extends generally parallel to the first PCB 30.

The first rigid portion 32 of the PCB 30 is connected to the housing 14 in any desired manner, such as by fasteners (not shown) and/or glue. The camera 12 and/or image sensor 26 are focused to provide a desired image quality or clarity. The connector 42 and second PCB 40 are connected to the second rigid portion 34 of the PCB 30 after the camera 12 and/or image sensor 26 are focused.

The connector 42 may produce strain on the first PCB 30 that may cause the first PCB to move relative to the housing 14 when the connector 42 is connected to the PCB 30. The flexible portion 36 of the first PCB 30 minimizes strain on the first portion 32 of the first PCB and, therefore, minimizes strain on the image sensor 26. The first portion 32 of the first PCB 30 with the image sensor 26 may be considered decoupled from the second portion 34 and the flexible portion 36 of the first PCB that may experience strain. The flexible portion 36 allows the first and second portions 32, 34 to move relative to each other. Therefore, relative movement between the lens 22 and the image sensor 26 is minimized.

Figure 2:
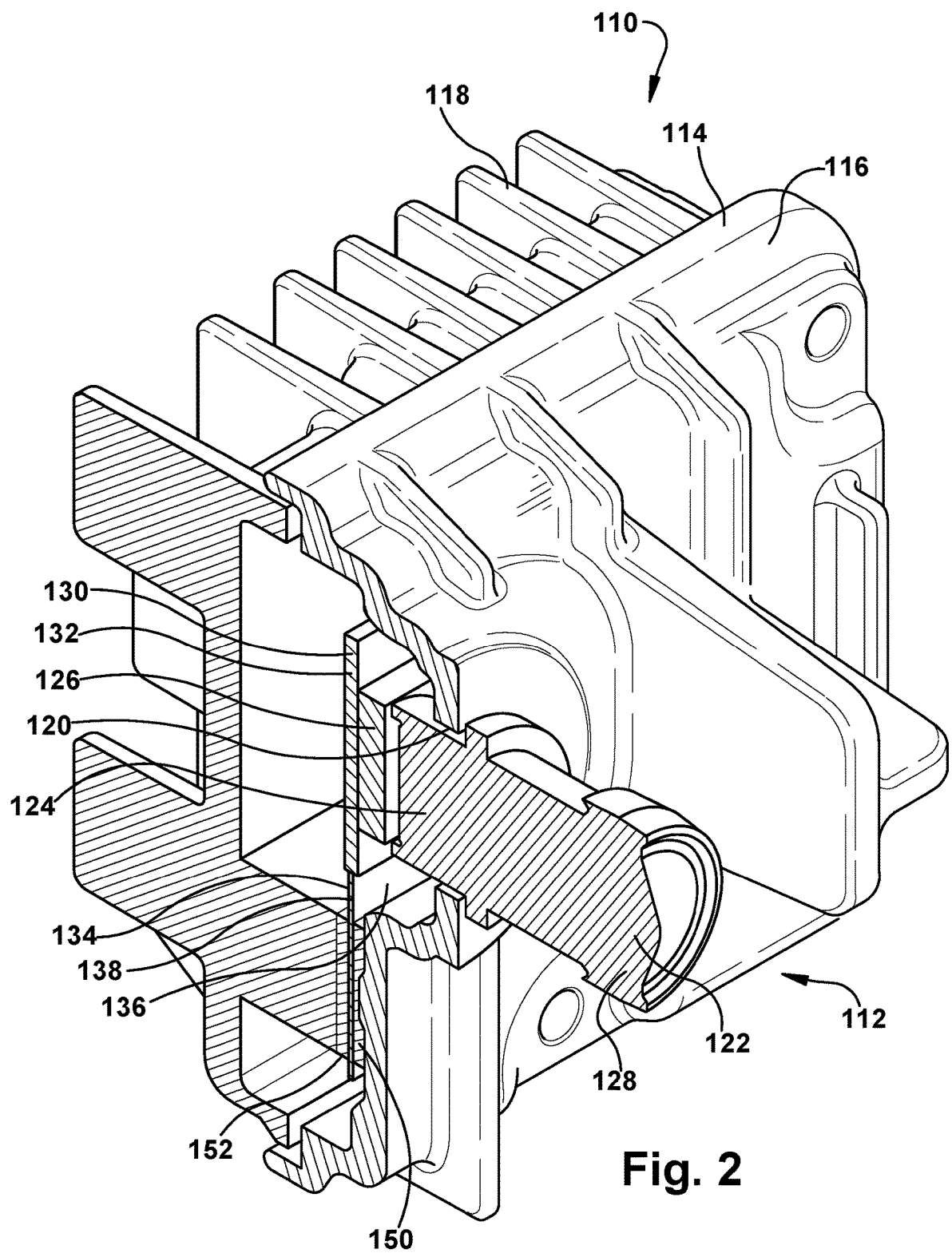
FIG. 2 is a schematic view of a driver assist system constructed in accordance with a second embodiment of the present invention.

FIG. 2 illustrates a second embodiment of a driver assist system constructed in accordance with the present invention. The driver assist system 110 includes a camera 112 having a housing 114. The housing 114 may have a first portion 116 connected to a second portion 118 to define an interior of the housing 114. The first portion 116 of the housing may have an opening 120 through which a lens 122 extends. A first axial end 124 of the lens 122 is connected to the housing 114. The first axial end 124 is supported within the housing 114 adjacent an image sensor 126. A second axial end 128 of the lens 122 extends through the opening 120 out of the housing 114.

The image sensor 126 senses an image acquired by the lens 122 and provides at least one signal to a vehicle safety system to provide a vehicle operator with a warning, haptic or tactile feedback, and/or autonomous control of the vehicle. The image sensor 126 is mounted on an imager printed circuit board (PCB) 130. The PCB 130 has a first rigid portion 132 and a second flexible portion 134. The image sensor 126 is connected to the first rigid portion 132 of the PCB 130. The first portion 132 of the PCB 130 is connected to the housing 114. The rigid portion 132 and the flexible portion 134 are movable relative to each other. The rigid portion 132 and the flexible portion 134 extend along a common axis. The flexible portion 134 may have a thickness that is less than the thicknesses of the rigid portion 132. It is contemplated that the flexible portion 134 may be formed in one-piece with the first rigid portion 132. The flexible portion 134 may be made of any desired material.

The second flexible portion 134 of the PCB 130 is connected to the first and second portions 116, 118 of the housing 114. The second flexible portion 134 of the PCB 130 has a first side 136 facing the first portion 116 of the housing 114 and a second side 138 facing the second portion 118 of the housing 114. A first thermal interface material 150 is connected to the first portion 116 of the housing 114 and the first side 136 of the second flexible portion 134. A second thermal interface material 152 is connected to the second portion 118 of the housing 114 and the second side 138 of the flexible portion 134. The first and second thermal interface materials 150, 152 may be pads, gels and/or pastes that conduct heat from the PCB 130 and the image sensor 126 to the housing 114 for dissipating the heat produced. The flexible portion 134 of the PCB 130 may include exposed copper GND that makes contact with at least one of the first and second thermal interface materials 150, 152. Although the first and second thermal interface materials 150, 152 are described as being connected to opposite sides of the flexible portion 134, it is contemplated that thermal interface material may only be connected to one of the first and second sides 136, 138 of the flexible portion.

The first rigid portion 132 of the PCB 130 is connected to the housing 114 in any desired manner, such as by fasteners (not shown) and/or glue. The camera 112 and/or image sensor 126 are focused to provide a desired image quality or clarity. The thermal interface materials 150, 152 are connected to the second flexible portion 134 of the PCB 130 and the housing 114 after the camera 112 and/or image sensor 126 are focused.

The first and second thermal interface materials 150, 152 may produce strain on the PCB 130 that may cause the PCB to move relative to the housing 114 when the thermal interface materials are connected to the PCB. The flexible portion 134 of the PCB 130 minimizes strain on the first rigid portion 132 of the PCB and, therefore, minimizes strain on the image sensor 126. The first portion 132 of the PCB 130 with the image sensor 126 may be considered decoupled from the second portion 134 of the PCB that may experience strain. The flexible portion 134 of the PCB 130 may move relative to the rigid portion 132. Therefore, relative movement between the lens 122 and the image sensor 126 is minimized.

From the above description of the invention, those skilled in the art will perceive improvements, changes and modifications. Although the first PCB 30 of the embodiment shown in FIG. 1 is described as having first and second rigid portions 32, 34 interconnected by a flexible portion 36, it is contemplated that the first PCB may only have one rigid portion to which the image sensor 26 is connected and a flexible portion connected to the second PCB 40 by the connector 32, similar to the embodiment of FIG. 2. Also, the PCB 130 of the embodiment of shown in FIG. 2 may have first and second rigid portions interconnected by a flexible portion with the first rigid portion connected to the image sensor 126 and the second rigid portion connected to the thermal interface materials 150, 152, similar to the embodiment of FIG. 1. Such improvements, changes and modifications within the skill of the art are intended to be covered by the appended claims.

Having described the invention, the following is claimed:

1. A driver assist system for a vehicle comprising:
   a housing;
   a lens having an axial end extending into the housing;
   a first printed circuit board (PCB) defining a first surface and a second surface, the second surface different from the first surface, mounted in the housing, the first PCB having a first rigid portion and a flexible portion, the first rigid portion and the flexible portion extending along a common axis and the first rigid portion is connected to the housing when mounted therein; and
   an image sensor mounted on the first rigid portion along the first surface of the first PCB adjacent the axial end of the lens,
   wherein the flexible portion connects the first rigid portion of the first PCB to a second rigid portion of the PCB, the image sensor being mounted on the first rigid portion of the first PCB adjacent the lens,
   wherein the first and second rigid portions of the PCB being movable relative to each other,
   wherein the second rigid portion is connected to a second PCB by a connector along the second surface.

2. The driver assist system as set forth in claim 1 wherein, the rigid portion and the flexible portion are movable relative to each other.

3. The driver assist system as set forth in claim 1 wherein the first and second rigid portions are coplanar.

4. The driver assist system as set forth in claim 1 wherein the second PCB extends generally parallel to the first and second rigid portions.

5. The driver assist system as set forth in claim 1 wherein the second PCB is connected to the housing.

6. The driver assist system as set forth in claim 1 wherein the flexible portion is connected to the housing by at least one thermal interface material.

7. The driver assist system as set forth in claim 6 wherein a first thermal interface material connects a first side of the flexible portion to the housing and a second thermal interface material connects a second side of the flexible portion facing opposite the first side to the housing.

8. The driver assist system as set forth in claim 1 wherein the rigid portion is decoupled from the flexible portion.

9. The driver assist system as set forth in claim 1 wherein the rigid portion and the flexible portion are formed as one piece.

10. The driver assist system as set forth in claim 1 wherein the flexible portion has a thickness less than the thickness of the rigid portion.

* * * * *